(12) United States Patent
Amaducci et al.

(10) Patent No.: US 10,694,619 B2
(45) Date of Patent: Jun. 23, 2020

(54) FILTER COMPRISING PRINTED CIRCUIT BOARD AND BUSBARS

(71) Applicant: Schaffner EMV AG, Luterbach (CH)

(72) Inventors: Alessandro Amaducci, Gerlafingen (CH); Marco Ranieri, Lupfig (CH); Jean-Pierre Greber, Kingersheim (FR); Michele Morra, Wiedlisbach (CH)

(73) Assignee: Schaffner EMV AG, Luterbach (CH)

( * ) Notice: Subject to any disclaimer, the term of this patent is extended or adjusted under 35 U.S.C. 154(b) by 0 days.

(21) Appl. No.: 16/272,683

(22) Filed: Feb. 11, 2019

(65) Prior Publication Data

US 2019/0246493 A1     Aug. 8, 2019

Related U.S. Application Data

(63) Continuation of application No. 15/674,179, filed on Aug. 10, 2017.

(30) Foreign Application Priority Data

Aug. 12, 2016 (DE) .................... 20 2016 104 468 U
Apr. 20, 2017 (DE) ........................ 10 2017 108 383

(51) Int. Cl.
*H05K 1/02* (2006.01)
*H03H 1/00* (2006.01)
(Continued)

(52) U.S. Cl.
CPC ......... *H05K 1/0233* (2013.01); *G01R 31/002* (2013.01); *G01R 31/31907* (2013.01); *H01P 1/20327* (2013.01); *H01P 3/08* (2013.01); *H03H 1/00* (2013.01); *H03H 7/427* (2013.01); *H05K 1/0216* (2013.01); *H05K 1/0231* (2013.01); *H03H 2001/005* (2013.01); *H05K 2201/086* (2013.01);
(Continued)

(58) Field of Classification Search
CPC .. H05K 1/0233; H05K 1/0216; H05K 1/0231; G01R 31/002; G01R 31/31907; H01P 1/20327; H01P 3/08; H03H 1/00; H03H 7/427; H03H 2001/005
See application file for complete search history.

(56) References Cited

U.S. PATENT DOCUMENTS

| 5,875,091 A | 2/1999 | Rieken |
| 2017/0149348 A1 | 5/2017 | Yanagimoto et al. |
| 2018/0198261 A1* | 7/2018 | Wurzinger ............... H02B 1/20 |

FOREIGN PATENT DOCUMENTS

| DE | 10200513509 A1 | 10/2005 |
| WO | WO-2012/059132 A1 | 5/2012 |

* cited by examiner

*Primary Examiner* — Robert J Pascal
*Assistant Examiner* — Kimberly E Glenn
(74) *Attorney, Agent, or Firm* — Blank Rome LLP

(57) ABSTRACT

A filter for electromagnetic noise comprising: a printed circuit board (5) having conductor tracks, having a first side and having a second side opposite the first side; a first busbar (1), which is secured on the first side of the printed circuit board (5) and is electrically connected to at least one of the conductor tracks; and a second busbar (2), which is secured on the second side of the printed circuit board (5) and is electrically connected to at least one of the conductor tracks. The printed circuit board (5) is arranged between the first busbar (1) and the second busbar (2) for the insulation thereof.

22 Claims, 5 Drawing Sheets

(51) Int. Cl.
*H03H 7/42* (2006.01)
*G01R 31/00* (2006.01)
*G01R 31/319* (2006.01)
*H01P 1/203* (2006.01)
*H01P 3/08* (2006.01)

(52) U.S. Cl.
CPC .............. *H05K 2201/09027* (2013.01); *H05K 2201/1003* (2013.01); *H05K 2201/10015* (2013.01); *H05K 2201/10272* (2013.01); *H05K 2201/10371* (2013.01); *H05K 2201/10409* (2013.01)

FILTER COMPRISING PRINTED CIRCUIT BOARD AND BUSBARS

CROSS-REFERENCE TO RELATED APPLICATIONS

This application is a continuation of U.S. application Ser. No. 15/674,179, filed Aug. 10, 2017, which claims the benefit of German Patent Application No. 20 2016 104 468.5, filed Aug. 12, 2016 and German Patent Application No. 10 2017 108 383.9, filed Apr. 20, 2017. The entire disclosures of which are hereby incorporated by reference.

TECHNICAL FIELD

The invention relates to a filter for electromagnetic noise comprising a printed circuit board and busbars.

PRIOR ART

Electronic systems in vehicles, e.g. in motor vehicles, are becoming ever more complex. The electrical parts are becoming ever more sensitive to electromagnetic noise and are also causing ever more radio interference. Therefore, filters for suppressing electromagnetic noise, e.g. EMI or EMC filters, are being employed more and more often in electrical systems of vehicles. Particularly in the case of electrically driven vehicles, this problem is particularly relevant on account of the high currents and the high switching speeds of current transformers.

Said filters are generally formed from a combination of one or more conductor rails, one or more inductances and one or more capacitors. In this case, in existing solutions, the inductances and capacitors are connected to the conductor rails either directly or via cables. In order to obtain an insulation between the electrical components, either sufficiently large distances or insulations, e.g. by potting the electronic components, are provided. However, the existing solutions have the problem that they do not satisfy the combination of requirements in vehicle construction regarding vibrations, simple production in high numbers, high production quality, small space requirement, low weight and flexibility for different power applications.

SUMMARY OF THE INVENTION

It is an object of the invention to find an improved filter that better complies with the combination of the requirements described.

According to the invention, this object is achieved by means of a filter as claimed in claim 1.

This allows to avoid complex cabling of electrical components or the mounting thereof directly on the busbars, since the electrical components now can be arranged on the printed circuit board simply and in a mechanically automated manner and can be connected to the busbars via conductor tracks. Moreover, the mounting of the electrical components, in particular of the busbars, of the capacitors and of the magnetic elements on conductor tracks allows very robust mounting which ensures a good, reliable connection with long-term stability even under severe vibrations.

Further embodiments are specified in the dependent claims.

In one embodiment, the filter comprises at least one magnetic element and at least one capacitor, wherein the busbars are separated from the printed circuit board at least in the region of the magnetic element. As a result, the magnetic elements around the busbars for realizing current-compensated inductors or current transformers can be made smaller and lighter. The capacitors as electrical components can be installed on the printed circuit board in a simple manner.

In one embodiment, the at least one magnetic element is ring-shaped in each case, and each at least one ring-shaped magnetic element is plugged by a ring opening of the magnetic element onto a projection of the printed circuit board. This type of mounting is simple, rapid and robust.

In one embodiment, the busbars are mechanically secured on the printed circuit board by securing means, wherein the securing means simultaneously ensure an electrical connection between the respective busbar and a corresponding conductor track of the printed circuit board. This has the advantage that complex and susceptible soldering connections are obviated.

In one embodiment, the first busbar and/or the second busbar bear with a contact area directly on the printed circuit board. This allows a particularly robust mechanical and electrical connection between busbars and the printed circuit board.

In one embodiment, the printed circuit board has a first conductor track area in the region of the contact area with the first busbar, wherein the first conductor track area produces an electrical contact between the first busbar and the first conductor track area. Furthermore, the printed circuit board has a second conductor track area in the region of the contact area with the second busbar, wherein the second conductor track area produces an electrical contact between the second busbar and the second conductor track area. This allows a particularly good electrical connection between the busbars and the printed circuit board. In addition, the busbar on the printed circuit board behaves like a conductor track.

In one embodiment, the filter comprises a metallic housing, wherein the housing has at least one ground potential area, wherein the printed circuit board has at least one ground conductor track area, wherein each of the at least one ground potential area of the housing is pressed onto a corresponding ground conductor track area by securing means and a ground connection from the printed circuit board to the housing is thus produced. This has the advantage that no additional cables between the filter housing and the printed circuit board are necessary.

BRIEF DESCRIPTION OF THE FIGURES

The invention is explained in greater detail with reference to the accompanying figures, in which.

WAYS OF EMBODYING THE INVENTION

Figure 1:
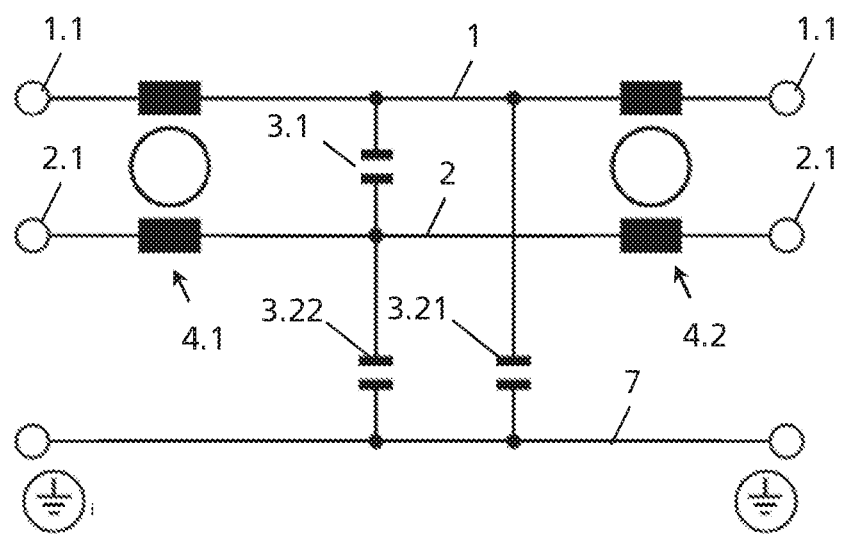
FIG. 1 shows a circuit of a first exemplary embodiment of a filter.
Figure 2:
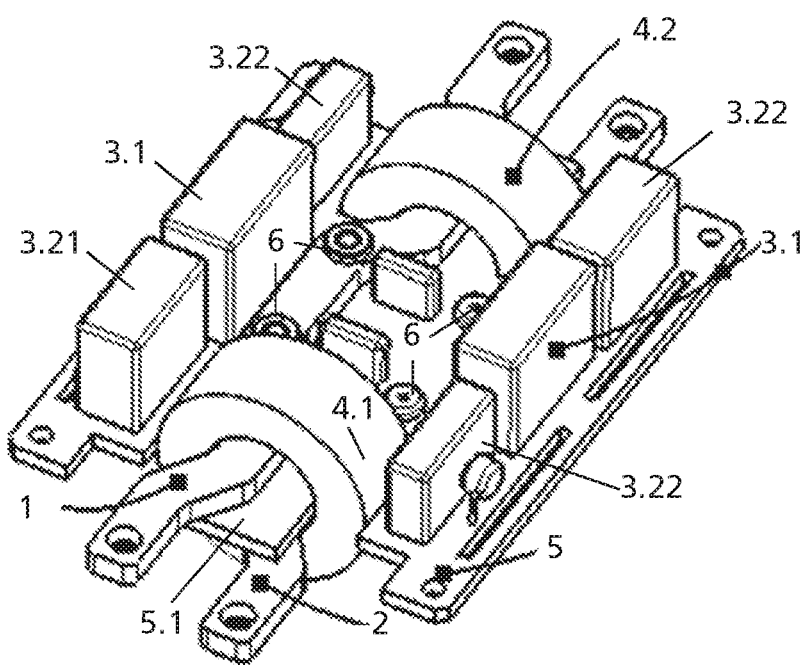
FIG. 2 shows a three-dimensional view of the first exemplary embodiment of the filter.
Figure 3:
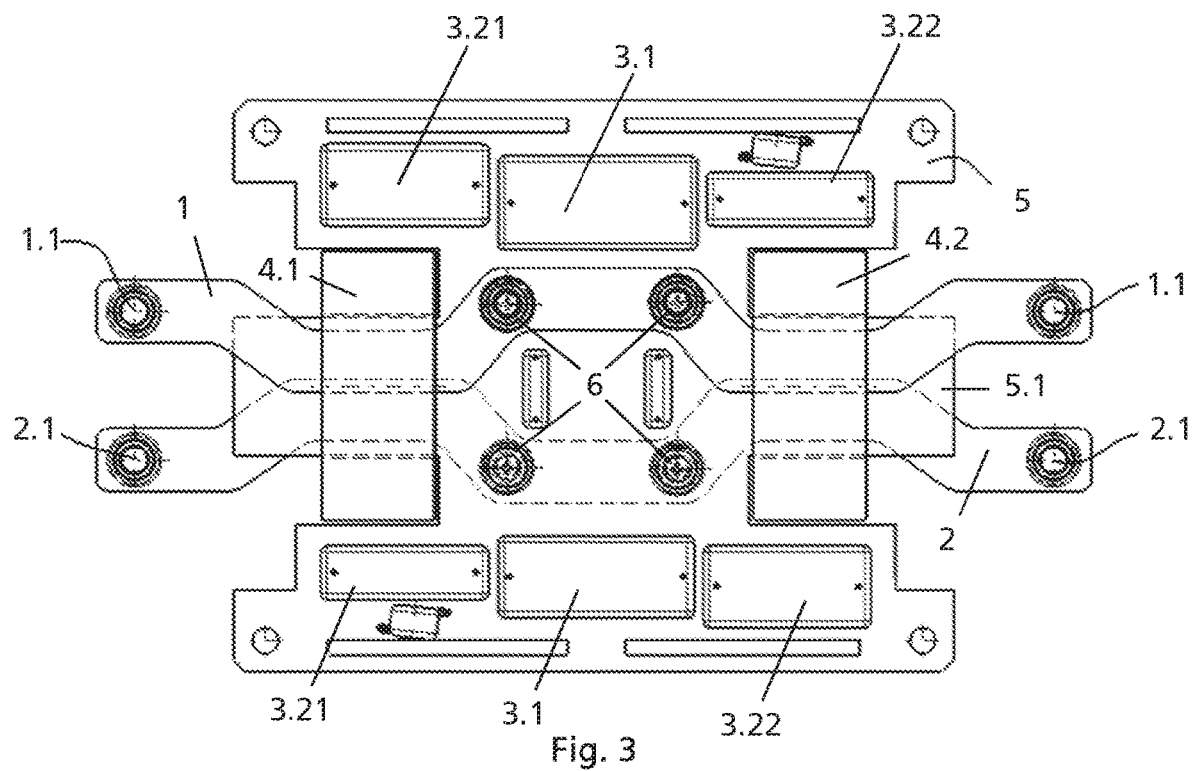
FIG. 3 shows a view from above of the first exemplary embodiment of the filter.

FIGS. 1 to 8 show a first exemplary embodiment of a filter according to the invention. The filter comprises a printed circuit board 5 having electrical components. Electrical components of the filter comprise a first busbar 1, a second busbar 2, at least one capacitor and at least one magnetic element.

The printed circuit board 5 is a board composed of an electrically insulating material with conductor tracks for connecting the electrical components of the filter. The printed circuit board 5 has a first side and a second side opposite the first side. In one embodiment, the printed circuit board 5 has at least one lateral side, which is or are arranged at right angles to the normal to the printed circuit board plane (plane of the first and second sides). In one embodiment, the printed circuit board 5 has four lateral sides. In one embodiment, the printed circuit board 5 has one or more cutouts and/or projections 5.1 on the at least one lateral side in order to plug the at least one magnetic element onto the printed circuit board 5 and hold said at least one magnetic element there.

The at least one magnetic element is arranged in each case in a ring-shaped fashion around the first and second busbars 1 and 2 and, in the first embodiment, together with the first and second busbars 1, 2 forms a current-compensated inductor. In this case, in a ring-shaped fashion means that the magnetic element forms a complete or at least a large part of a closed curve around the first and second busbars 1 and 2, such that the magnetic element forms a current-compensated inductor with the two busbars 1 and 2 and the two busbars 1 and 2 are led through the ring opening shaped by the magnetic element. The closed curve preferably forms a circle (torus), but in other examples may also be shaped as rectangular, square, n-gonal (polygonal) or in some other way. In the case of a torus (bagel-shaped), the cross section of the circumferential torus bulge is preferably rectangular. This facilitates the securing of the ring-shaped magnetic element on a projection 5.1 of the printed circuit board 5. In this case, the magnetic element preferably forms a closed ring. However, the magnetic element can also form a non-closed ring or a ring composed of a plurality of partial sectors (e.g. two half-toroids).

In the first exemplary embodiment, the at least one magnetic element comprises two magnetic elements 4.1 and 4.2. Preferably, the latter are formed identically and/or secured on the printed circuit board 5 in an identical way. Preferably, these two magnetic elements 4.1 and 4.2 are arranged on opposite lateral sides of the printed circuit board 5. The two busbars 1 and 2 preferably extend, in principle, along a longitudinal axis through both ring openings of the two magnetic elements 4.1 and 4.2.

The at least one capacitor is electrically connected to the first and second busbars 1 and 2 via the conductor tracks of the printed circuit board 5. Each of the at least one capacitor is electrically connected by one of the known securing methods on the printed circuit board 5. In one embodiment, the through-hole technology (THT) customary in power electronics is used, although surface-based mounting techniques such as SMD or other mounting techniques are also possible.

In the first exemplary embodiment, the at least one capacitor comprises a current capacitor 3.1 (also called X capacitor) connected between the first busbar 1 and the second busbar 2, as is shown for example in the circuit in FIG. 1. In the exemplary embodiment with two magnetic elements 4.1 and 4.2, the current capacitor 3.1 is contacted with the first and second busbars 1 and 2 between the two magnetic elements 4.1 and 4.2. Alternatively or additionally, the at least one capacitor comprises a first ground capacitor 3.21 which is connected between the first busbar 1 and ground 7, and/or a second ground capacitor 3.22 which is connected between the second busbar 2 and ground 7, as shown for example in the circuit in FIG. 1. In the exemplary embodiment with two magnetic elements 4.1 and 4.2, the ground capacitors 3.21 and 3.22 are preferably contacted with the first and second busbars 1 and 2 between the two magnetic elements 4.1 and 4.2. Each functional capacitor, such as, for example, the current capacitor 3.1 and the ground capacitors 3.21 and 3.22, can itself consist of a plurality of connected individual capacitor units which are in each case individually connected to the printed circuit board 5. In general, the capacitor units of a functional capacitor are interconnected in parallel with one another by means of the conductor tracks of the printed circuit board 5. However, a series concatenation of the capacitor units is also conceivable for very high currents. In the exemplary embodiment in FIGS. 2 and 3, the ground capacitors 3.21 and 3.22 and the current capacitor consist for example in each case of two capacitor units connected in parallel.

FIG. 1 shows a first exemplary embodiment of a filter, although many other filter circuits composed of at least one capacitor and at least one magnetic element are possible. In one embodiment, the filter is a passive filter. In one embodiment, the filter is an EMI or EMC filter. In one embodiment, the filter is designed for a power range of greater than 500 W and/or a current range of greater than 50 A.

The first busbar 1 and the second busbar 2 are composed of an electrically conductive, preferably metallic, material. The busbars 1 and 2 are rigid (in contrast to flexible cables and wires). In this case, the first busbar 1 is secured on the first side of the printed circuit board 5 and the second busbar 2 is secured on the second side of the printed circuit board 5, such that the first and second busbars 1 and 2 are electrically insulated from one another by the insulating printed circuit board 5 and there is no risk of a short circuit. The busbars 1 and 2 are designed for conducting the system current. This is preferably a DC current. Preferably, the cross-sectional area of each current conductor 1 and 2 is at least ten square millimeters, preferably at least 20 square millimeters.

The first busbar 1 and the second busbar 2 in each case have a first end and a second end, wherein each end has a connection terminal 1.1, 2.1. In one embodiment, the cross section of the busbars at right angles to the current direction is rectangular. This is one possibility for achieving a flat bearing area for the respective busbar 1 and 2 on the flat printed circuit board 5. In one embodiment, the ends of the busbars 1 and 2 with the connection terminals 1.1 and 2.1, project beyond the lateral sides of the printed circuit board 5, such that the filter can be connected in a simple manner to cables or plugs or other connections of an electrical network of a vehicle. In one embodiment, the filter furthermore comprises a housing (not illustrated in the figures), which encloses (preferably all) electronic components of the filter, wherein the four ends of the two busbars 1 and 2 with the four connection terminals 1.1 and 2.1 project from the housing.

In one embodiment, the busbars 1 and 2 are secured on the printed circuit board 5 in each case by securing means 6, such as screws, threaded pins, clips, rivets, printed circuit board inserts (PCB inserts), soldering areas or other securing means.

In one embodiment, the secured first busbar 1 bears directly on the first side of the printed circuit board 5. This has the advantage that the first busbar 1 bears with a large area on the printed circuit board 5 and thus allows a stable connection even under severe vibrations. In one embodiment, the first busbar 1 is not arranged in a recessed manner on the first side of the printed circuit board 5. In one embodiment, the cross section of the first busbar 1 at right angles to the current flow direction or to the longitudinal axis of the first busbar 1 is such that it forms a planar contact area with the first side of the printed circuit board 5. In one embodiment, the cross section of the first busbar 1 at right angles to the current flow direction or to the longitudinal axis of the first busbar 1 is at right angles, with one of the four sides forming the contact area. Upon securing on the printed circuit board 5, said contact area of the first busbar 1 is in physical contact with the printed circuit board 5, i.e. touches the printed circuit board 5. In one embodiment, said contact area between the first busbar 1 and the printed circuit board 5, in the current flow direction, extends over at least 30%, preferably at least 40%, preferably at least 50%, preferably at least 60%, preferably at least 70%, preferably at least 80%, of the length of the printed circuit board 5 and/or of the length of the first busbar 1 projected onto the printed circuit board 5. The secured second busbar 2 also bears directly on the second side of the printed circuit board 5, and the previous descriptions concerning the bearing of the first busbar 1 on the first side of the printed circuit board 5 are likewise applied to the bearing of the second busbar 2 on the second side of the printed circuit board 5.

Figure 7:
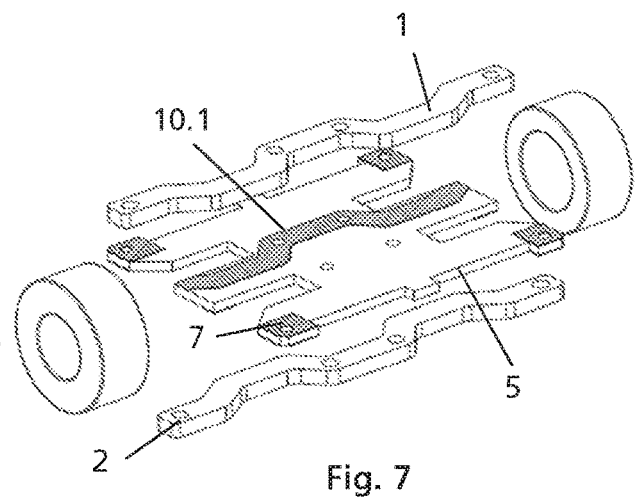
FIG. 7 shows a first exploded view of the first exemplary embodiment of the filter with the printed circuit board, the busbars and the magnetic elements.
Figure 6:
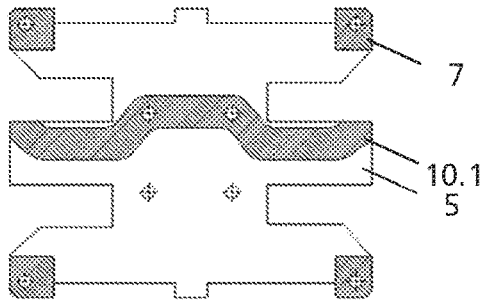
FIG. 6 shows a view of a second side of a printed circuit board of the first exemplary embodiment of a filter.

In one embodiment, the first side of the printed circuit board 5 has a first conductor track area 10.1 in the region of the contact area with the first busbar 1. As a result, it is possible to produce a large-area electrical contact between the first busbar 1 and the printed circuit board 5. Preferably, said first conductor track area 10.1 is formed parallel to the printed circuit board plane. Preferably, the first conductor track area 10.1 covers at least 10%, preferably at least 20%, at least 30%, preferably at least 40%, preferably at least 50%, preferably at least 60%, preferably at least 70%, preferably at least 80%, preferably at least 90%, of the contact area of the first busbar 1 with the printed circuit board 5. As a result, the first busbar 1 on the printed circuit board 5 behaves like a conductor track. FIGS. 6 and 7 show the first side of the printed circuit board 5 and the conductor track area 10.1 below the first busbar 1. The electrical contact and/or the mechanical securing can be produced by a soldering connection. Alternatively or additionally, the electrical contact can also be produced by a pressure from the first busbar 1 on the first side of the printed circuit board 5, said pressure being caused by the securing means 6. Preferably, the securing means 6 are arranged in the printed circuit board 5 in the region of the contact area with the first busbar 1 or in the region of the first conductor track area 10.1, such that the securing means 6 press the first busbar 1 onto the first conductor track area 10.1. The first conductor track area 10.1 can also be composed of a plurality of first conductor track areas separated from one another, e.g. if the first busbar 1 has different connecting points (or contact areas), e.g. upstream and downstream of the magnetic element. For the same reason, the second side of the printed circuit board 5 has a second conductor track area 10.2 in the region of the contact area with the second busbar 2 (see FIG. 5). The second conductor track area 10.2, with respect to the second busbar 2 and the second side of the printed circuit board 5, has features corresponding to those of the first conductor track area 10.1 with respect to the first busbar 1 and the first side of the printed circuit board 5.

Alternatively or additionally, the securing means 6 electrically contact the busbars 1 and 2 with corresponding conductor tracks of the printed circuit board 5. This can be achieved, for example, by embodying the cutouts or threads of the printed circuit board 5 for the securing means 6 with an electrically conductive, e.g. metallic, surface that is connected to the corresponding conductor track. A sufficiently large and stable contact area between the conductor track and the corresponding busbar 1, 2 is produced as a result. However, other contact means such as e.g. contact areas parallel to the printed circuit board plane and/or else soldering contacts are also possible.

In one exemplary embodiment, the busbars 1 and 2 are formed in a meandering fashion in each case in opposite directions, such that the busbars 1 and 2 are at different distances from one another in different regions. In one embodiment, the distance between the first busbar 1 and the second busbar 2 is smaller in the region of the at least one magnetic element compared with the region of the securing means 6, particularly if the securing means 6 extend through the printed circuit board 5 onto the other side and there is the risk of a flashover or short circuit between the securing means 6, electrically connected to one busbar 1 or 2, and the other busbar 2 or 1. In one embodiment, the distance between the first busbar 1 and the second busbar 2 is smaller in the region of the at least one magnetic element compared with the region of the ends of the busbars 1 and 2 that project beyond the printed circuit board 5. This is advantageous in particular since, in this region, the busbars 1 and 2 are no longer insulated from one another by the printed circuit board 5 and a larger safety distance is thus required. In one embodiment, the busbars 1 and 2 are identical; if they are shaped in a meandering fashion in opposite directions, they can simply be arranged on the printed circuit board 5 in a manner rotated by 180° in order to achieve the characteristic in opposite directions.

Figure 4:
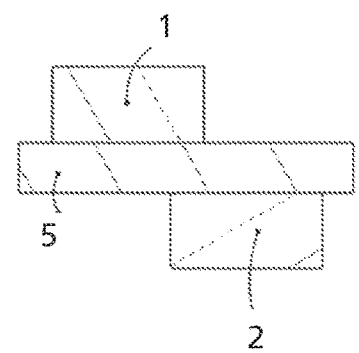
FIG. 4 shows a sectional view through the busbars and the printed circuit board in the region of a magnetic element of the first exemplary embodiment.
Figure 5:
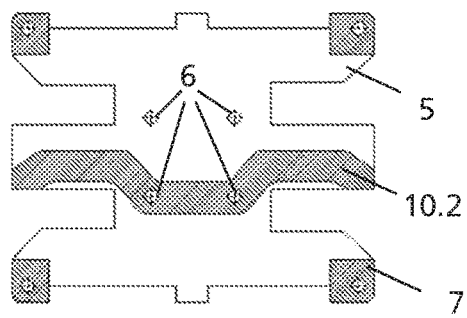
FIG. 5 shows a view of a first side of a printed circuit board of the first exemplary embodiment of a filter.

FIG. 4 shows a section through a part of the printed circuit board 5, of the first busbar 1 and of the second busbar 2 in the region of the magnetic element (in the ring opening thereof). Preferably, the first and second busbars 1 and 2 are arranged on the printed circuit board 5 such that the projections of the busbars 1 and 2 onto the printed circuit board 5 at least partly overlap. As a result, the ring opening can be made smaller and the magnetic element can be made smaller and thus lighter.

Figure 8:
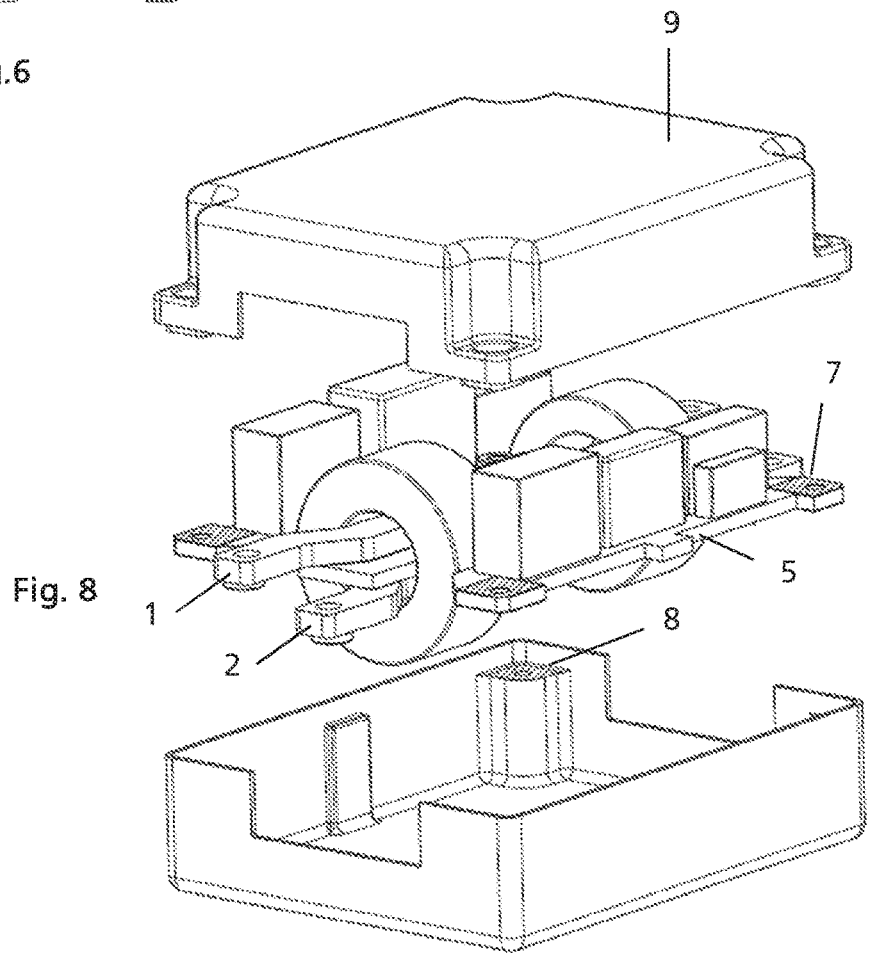
FIG. 8 shows a first exploded view of the first exemplary embodiment of the filter with the filter and its housing.

FIG. 8 shows a housing 9 of the filter. Preferably, the printed circuit board 5 has at least one ground conductor track area 7. In FIG. 8, four ground conductor track areas 7 are arranged in the four corners of the printed circuit board 5. Said ground conductor track areas 7 can be arranged on the first side and/or on the second side of the printed circuit board 5. The at least one ground conductor track area 7 defines the ground potential of the filter on the printed circuit board 5. The ground conductor track area 7 is connected to the metallic housing 9. This is for example achieved via at least one ground potential area 8 in the housing 9, which, with the housing 9 assembled, presses against the at least one ground conductor track area 7 and thus produces the ground connection to the housing 9. As a result, a ground connection to the housing via an additional cable becomes superfluous. Preferably, a securing cutout passes through the at least one ground conductor track area 7 and/or the at least one ground potential area 8. As a result, a good ground connection can already be obtained as a result of the securing of the printed circuit board 5 on the housing 9. Preferably, the housing 9 has a first shell for covering the first side of the printed circuit board 5 and a second shell for covering the second side of the printed circuit board 5. The two shells each have a securing cutout in the region of the at least one ground conductor track area 7 and/or the at least one ground potential area 8. As a result, the printed circuit board 5 can be compressed by means of a screw connection between the first shell and the second shell in the region of the at least one ground conductor track area 7.

FIGS. 9 to 12 show a second exemplary embodiment of a filter according to the invention. The filter comprises a printed circuit board 15 with electrical components. Electrical components of the filter comprise a first busbar 11, a second busbar 12, at least one capacitor 13 and at least one magnetic element 14. Unless explicitly described otherwise, the description of the printed circuit board 5 and of the electrical components of the first exemplary embodiment also applies to the printed circuit board 15 and the electrical components of the second exemplary embodiment.

Figure 9:
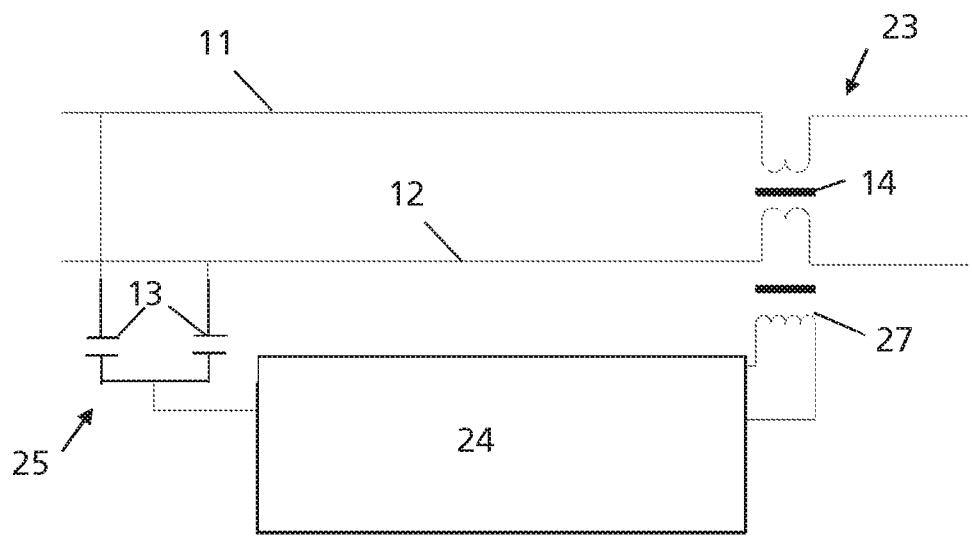
FIG. 9 shows a circuit of a second exemplary embodiment of a filter.
Figure 10:
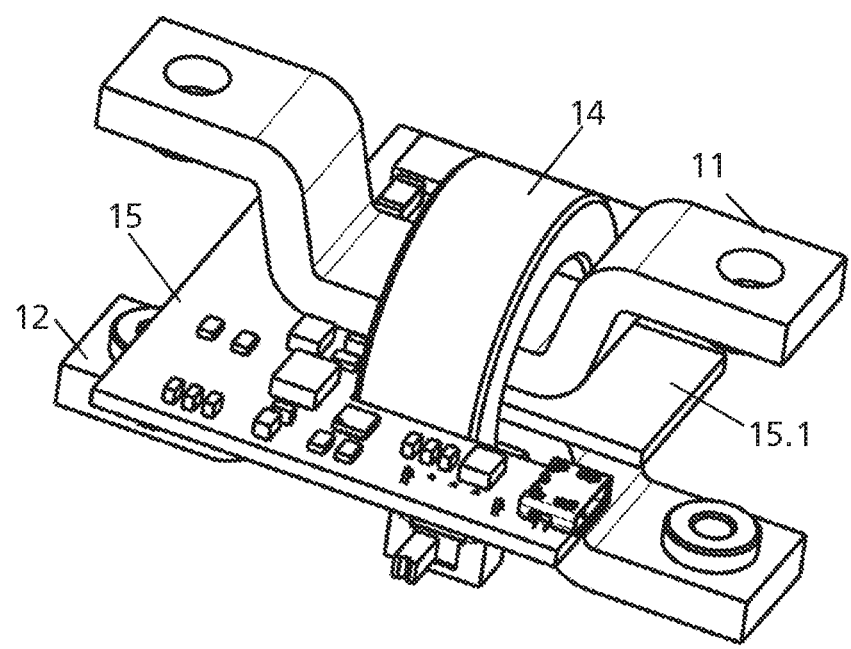
FIG. 10 shows a three-dimensional view of the second exemplary embodiment of the filter.
Figure 11:
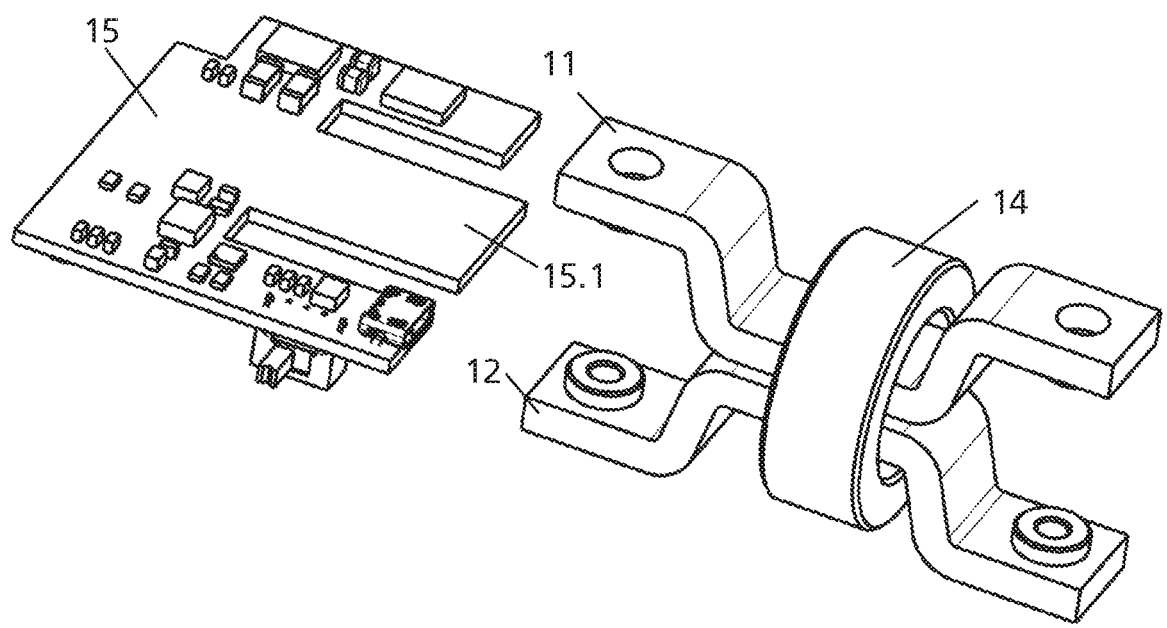
FIG. 11 shows a three-dimensional view of the second exemplary embodiment of the filter before the assembly of PCB, busbars and magnetic element.
Figure 12:
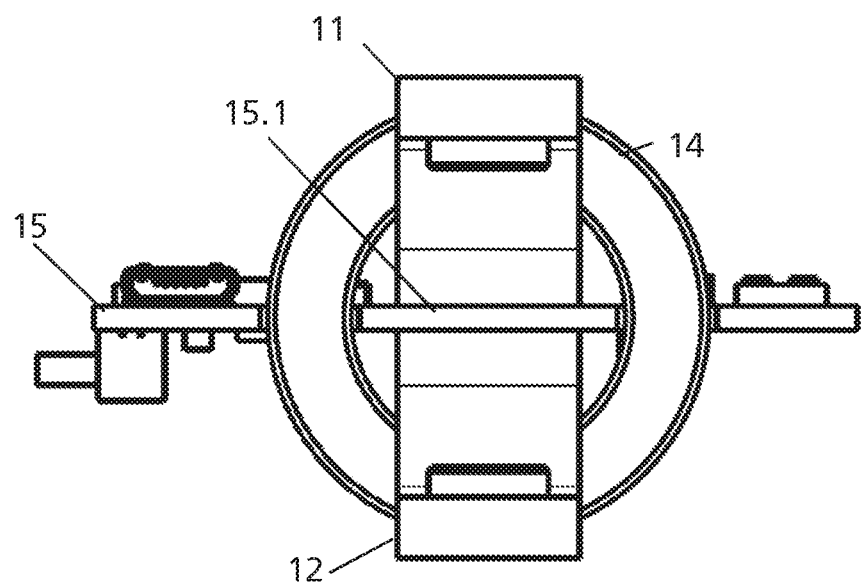
FIG. 12 shows a first side view of the second exemplary embodiment of the filter.

FIG. 9 shows a circuit diagram for the second exemplary embodiment. Here the filter is embodied as an active filter. The active filter comprises a current transformer 23, an amplifying circuit 24 and a capacitor 13. The active filter is preferably an EMI or EMC filter. The filter is preferably designed for a power range of greater than 500 W and/or a nominal current of greater than 50 A.

The current transformer 23 converts the AC noise currents of the first and second busbars 11 and 12 into a measurement current in the auxiliary winding 27. For this purpose, the magnetic element 14 couples the first and second busbars 11 and 12 to the auxiliary winding 27. Preferably, for this purpose, the magnetic element is arranged in a ring-shaped fashion around the first and second busbars 1 and 2 as described in the first exemplary embodiment. Preferably, the current transformer 23 forms a current-compensated common-mode current transformer. The auxiliary winding 27 can be configured as a conductor track on the printed circuit board 15. However, it is also possible to realize the auxiliary winding as wire connected to the printed circuit board 15 or one of the electrical components of the printed circuit board 15.

The amplifying circuit 24 generates the compensation current or the compensation voltage on the basis of the AC currents measured in the current transformer.

The capacitor 13 is designed to input the compensation current or the compensation voltage into the first busbar 11 and the second busbar 12, in order thus to extinguish the AC noise currents or voltages of the first busbar 11 and of the second busbar 12 at least in the range of the bandwidth of the active filter. As also described in the first exemplary embodiment, the two capacitors 13 are in each case mounted on the printed circuit board 15 and connected to the first busbar 11 or the second busbar 12 by means of conductor tracks.

As in the first embodiment, in this case the first busbar 11 is secured on the first side of the printed circuit board 15 and the second busbar 12 is secured on the second side of the printed circuit board 15, such that the first and second busbars 11 and 12 are electrically insulated from one another by the insulating printed circuit board 15 and there is no risk of a short circuit.

The first busbar 11 and the second busbar 12 in each case have a first end and a second end, wherein each end has a connection terminal. In one embodiment, the cross section of the busbars at right angles to the current direction is rectangular. This is one possibility for achieving a flat bearing area for the respective busbar 11 and 12 on the flat printed circuit board 15. In one embodiment, the ends of the busbars 11 and 12 with the connection terminals project beyond the lateral sides of the printed circuit board 15, such that the filter can be connected in a simple manner to cables or plugs or other connections of an electrical network of a vehicle. In one embodiment, the filter furthermore comprises a housing (not illustrated in the figures), which encloses (preferably all) electronic components of the filter, wherein the four ends of the two busbars 11 and 12 with the four connection terminals project from the housing.

In one exemplary embodiment, the busbars 11 and 12 are secured on the printed circuit board 15 in each case by securing means such as screws, threaded pins, clips, rivets, printed circuit board inserts, soldering connections or other securing means. The embodiments for securing and for contacting the busbars 11 and 12 with the printed circuit board 15 are as in the first exemplary embodiment.

In one exemplary embodiment, the busbars 11 and 12 are formed such that the busbars 11 and 12 are at different distances from one another in different regions. Preferably, the distance between the first busbar 11 and the second busbar 12 is smaller in the region of the magnetic element compared with the region of the ends of the busbars 11 and 12 that project beyond the printed circuit board 15. This is advantageous in particular since the busbars 11 and 12 are no longer insulated from one another by the printed circuit board 15 in this region and a larger safety distance is thus required. Preferably, the distance between the busbars 11 and 12 in the region of the magnetic element, in particular in the opening of the toroidal core 14, is minimal. Preferably, the busbars 11 and 12 are identical, and can be arranged on the printed circuit board 15 in a manner rotated by 180°, in order to obtain the different distances. In contrast to the first exemplary embodiment, the different distance is realized by a greater distance from the printed circuit board plane of the printed circuit board 15, whereas in the first exemplary embodiment the larger distance is achieved by a lateral arrangement in the printed circuit board plane.

The first busbar 1 and the second busbar 2 are completely overlapping in the region of the magnetic element (in the ring opening thereof), whereas there is only a partial overlap in the first exemplary embodiment. However, it is also possible to realize a complete overlap in the first exemplary embodiment and/or only a partial overlap in the second exemplary embodiment.

With the filter according to the invention it is possible to obtain a small and light filter of high quality whose design and dimensions can be used for a large range of voltages, currents and/or powers.

The invention claimed is:

1. A filter for electromagnetic noise in an electrical DC voltage network of a vehicle comprising:
   a printed circuit board having at least one conductor tracks,
   a first busbar, which is electrically connected to at least one first conductor track of the conductor tracks;
   a second busbar, which is electrically connected to at least one second conductor track of the conductor tracks;

at least one magnetic element arranged in a ring-shaped fashion around the first and second busbars, wherein the at least one magnetic element forms a ring composed of a plurality of partial sectors; and at least one capacitor connected to the first busbar via the at least one first conductor track and connected to the second busbar via the at least one second conductor tracks.

2. The filter as claims in claim 1, wherein the at least one magnetic element forms a ring composed of two half-toroids.

3. The filter as claimed in claim 1, wherein the filter comprises a housing, wherein the housing has at least one ground potential area, wherein the printed circuit board has at least one ground conductor track area, wherein the at least one ground potential area of the housing is pressed onto a corresponding one of the at least one ground conductor track area by securing means and a ground connection from the printed circuit board to the at least one ground potential area of the housing is produced.

4. The filter as claimed in claim 1, wherein the filter is designed for a power range of greater than 500 watts and/or for a current range of greater than 50 A.

5. A filter for electromagnetic noise in an electrical DC voltage network of a vehicle comprising:
a printed circuit board having at least one conductor track,
a first busbar, which is electriclly connected to at least one first conductor track of the conductor tracks;
a second busar, which is electrically connected to at least one second conductor track of the conductor tracks;
at least one magnetic element arrange in a ring-shaped fashion around the first and second busbars, wherein the at least one magnetic element together with the first and second busbars forms a current-compensated inductor; and
at least one capacitor connected to the first busbar via the at least one first conductor track and connected to the second busbar via the at least one second conductor track.

6. The filter as claimed in claim 5, wherein the at least one magnetic element is formed as a magnetic toroidal core, wherein the first and second busbars are led through the ring opening of the magnetic toroidal core.

7. The filter as claimed in claim 6, wherein the magnetic toroidal core is plugged onto a projection of the printed circuit board.

8. The filter as claimed in claim 5, wherein the at least one magnetic element together with the first and second busbars forms two current-compensated inductors.

9. The filter as claimed in claim 5, wherein the at least one capacitor comprises a current capacitor connected between the first and second busbars.

10. The filter as claimed in claim 5, wherein the at least one capacitor comprises a first ground capacitor, which is connected between the first busbar and ground, and a second ground capacitor, which is connected between the second busbar and ground.

11. The filter as claimed in claim 5, wherein the first and second busbars have in each case a first end having a first connection terminal and a second end having a second connection terminal, wherein the first end and the second end of the first and second busbars in each case project beyond the printed circuit board.

12. The filter as claimed in claim 11, wherein the distance between the first busbar and the second busbar is greater in the region of the first and/or second ends than in the region of the at least one magnetic element.

13. The filter as claimed in claim 5, wherein the first busbar bears with a contact area directly on the printed circuit board.

14. The filter as claimed in claim 5, wherein the printed circuit board has a first conductor track area in the region of a contact area with the first busbar, wherein the first conductor track area produces an electrical contact between the first busbar and the first conductor track area.

15. The filter as claimed in claim 8, wherein the at least one capacitor comprises a current capacitor connected between the first and second busbars, wherein the at least one capacitor comprises a first ground capacitor, which is connected between the first busbar and ground, and a second ground capacitor, which is connected between the second busbar and ground, wherein the current capacitor is connected to the first busbar and the second busbar between the two current compensated inductors, wherein the first ground capacitor is connected to the first busbar between the two current compensated inductors and the second ground capacitor is connected to the second busbar between the two current compensated inductors.

16. A filter for electromagnetic noise in an electrical DC voltage network of a vehicle comprising:
a printed circuit board having at least one conductor track,
a first busbar, which is electrically connected to at least one first conductor track of the conductor tracks;
a second busbar, which is electrically connected to at least one second conductor track of the conductor tracks;
at least one magnetic element arranged in a a ring-shaped fashion around the first and second busbars; and
at least one capacitor connected to the first busbar via the at least one first concductor track and connected to the second busbar via the at least one second conductor track, wherein the filter is an active filter.

17. The filter as claimed in claim 16, wherein the at least one magnetic element together with the first and second busbars forms a current transformer in order to convert noise currents in the first and second busbars into a measurement current in an auxiliary winding.

18. The filter as claimed in claim 16, wherein the at least one capacitor comprises a first coupling capacitor, in order to input a compensation current generated on the basis of a measurement current into the first busbar, and a second coupling capacitor, in order to input the compensation current into the second busbar.

19. A filter for electromagnetic noise comprising:
a printed circuit board having conductor tracks,
a first busbar, which is electrically connected to at least one first conductor tracks of the conductor tracks;
a second busbar, which is electrically connected to at least one second conductor track of the conductor tracks,
wherein the first busbar bears with a contact area directly on the printed circuit board, wherein the printed circuit board has a first conductor track area in a region of a contact area with the first busbar, wherein he first conductor track contact area produces an electrical contact between the first busbar and the first conductor track area.

20. The filter as claimed in claim 19, wherein the second busbar bears with a contact area directly on the printed circuit board, wherein the printed circuit board has a second conductor track area in a region of a contact area with the second busbar, wherein the second conductor track area produces an electrical contact between the second busbar and the second conductor track area.

21. A vehicle comprising an electrical DC voltage network and a filter connected to the electrical DC voltage network, the filter comprising:
- a printed circuit board having conductor tracks,
- a first busbar, which is electrically connected to at least one first conductor track of the conductor tracks;
- a second busbar, which is electrically connected to at least one second conductor track of the conductor tracks;
- at least one magnetic element arranged in a ring-shaped fashion around the first and second busbars; and
- at least one capacitor connected to the first busbar via the at least one first conductor track and connected to the second busbar via the at least one second conductor tracks, wherein the at least one capacitor comprises a current capacitor connected between the first busbar and second busbar.

22. The vehicle as claimed in claim 21, wherein the vehicle is driven for locomotion by an electric motor.

\* \* \* \* \*